United States Patent
Zhang et al.

(10) Patent No.: US 9,148,328 B2
(45) Date of Patent: Sep. 29, 2015

(54) DIGITAL I/Q IMBALANCE COMPENSATION IN A QUADRATURE RECEIVER

(75) Inventors: Yaming Zhang, Plano, TX (US); John Alexander Interrante, Richardson, TX (US); William Hurley, Murphy, TX (US); Lup M. Loh, Plano, TX (US)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 517 days.

(21) Appl. No.: 13/282,288

(22) Filed: Oct. 26, 2011

(65) Prior Publication Data

US 2012/0106686 A1    May 3, 2012

Related U.S. Application Data

(60) Provisional application No. 61/408,419, filed on Oct. 29, 2010.

(51) Int. Cl.
*H04L 27/38*    (2006.01)
*H04B 15/00*    (2006.01)

(52) U.S. Cl.
CPC ............ *H04L 27/3863* (2013.01); *H04B 15/00* (2013.01)

(58) Field of Classification Search
CPC .. H04L 27/3863; H04L 27/364; H03D 3/009; H03D 3/008; H04B 10/697; H04B 15/00
USPC ......... 375/229, 232, 285, 340, 344, 346, 349, 375/350
See application file for complete search history.

(56) References Cited

U.S. PATENT DOCUMENTS

| | | | | |
|---|---|---|---|---|
| 5,848,105 | A * | 12/1998 | Gardner et al. | 375/336 |
| 6,178,314 | B1 * | 1/2001 | Whikehart et al. | 455/188.1 |
| 6,313,703 | B1 * | 11/2001 | Wright et al. | 330/149 |
| 6,507,602 | B1 * | 1/2003 | Dent | 375/142 |
| 6,697,438 | B2 * | 2/2004 | Doetsch et al. | 375/316 |
| 7,088,289 | B1 * | 8/2006 | Peltola | 342/377 |
| 7,417,517 | B2 * | 8/2008 | Hernandez et al. | 333/204 |
| 7,957,480 | B2 * | 6/2011 | Egashira et al. | 375/260 |
| 8,199,864 | B1 * | 6/2012 | Kim et al. | 375/350 |
| 8,406,344 | B2 * | 3/2013 | Eitel | 375/324 |
| 8,649,464 | B2 * | 2/2014 | Eitel | 375/324 |
| 2002/0090915 | A1 * | 7/2002 | Komara et al. | 455/69 |
| 2002/0158990 | A1 * | 10/2002 | Kishi | 348/614 |
| 2003/0072393 | A1 * | 4/2003 | Gu | 375/322 |
| 2003/0195910 | A1 * | 10/2003 | Corless et al. | 708/322 |
| 2006/0029150 | A1 * | 2/2006 | Capozio | 375/269 |

(Continued)

OTHER PUBLICATIONS

International Search Report dated Apr. 27, 2012 in connection with International Patent Application No. PCT/KR2011/008151.

*Primary Examiner* — Jean B Corrielus

(57) ABSTRACT

An apparatus and method reduce distortion in a processed signal. The apparatus includes a first receive path, a second receive path, a summation unit, and a compensation unit. The first receive path is configured to process a received analog signal into a first digital signal. The second receive path is configured to process the received analog signal with a phase shift into a second digital signal. The summation unit is configured to sum the first and second digital signals to form a processed digital signal. The compensation unit is configured to identify a conjugate of the processed digital signal, apply a weighting factor to the conjugate of the processed digital signal to form a weighted signal, and subtract the weighted signal from the processed digital signal to reduce the distortion.

20 Claims, 6 Drawing Sheets

(56) References Cited

U.S. PATENT DOCUMENTS

| | | |
|---|---|---|
| 2006/0062324 A1 | 3/2006 | Naito et al. |
| 2007/0201351 A1* | 8/2007 | Egashira et al. .............. 370/208 |
| 2008/0076357 A1* | 3/2008 | Chen et al. ................... 455/63.1 |
| 2008/0089443 A1* | 4/2008 | Sanada et al. ................. 375/319 |
| 2008/0153446 A1* | 6/2008 | Isaac et al. ................... 455/269 |
| 2008/0159442 A1 | 7/2008 | Tanabe et al. |
| 2008/0166985 A1 | 7/2008 | Wortel et al. |
| 2009/0010358 A1 | 1/2009 | Jaganathan et al. |
| 2009/0034592 A1* | 2/2009 | Mirfakhraei et al. ......... 375/222 |
| 2010/0074382 A1* | 3/2010 | Miyauchi et al. ............. 375/347 |
| 2010/0178057 A1* | 7/2010 | Shieh .............................. 398/79 |
| 2011/0128930 A1* | 6/2011 | Furuskar et al. .............. 370/329 |

* cited by examiner

DIGITAL I/Q IMBALANCE COMPENSATION IN A QUADRATURE RECEIVER

CROSS-REFERENCE TO RELATED APPLICATION(S) AND CLAIM OF PRIORITY

The present application is related to U.S. Provisional Patent Application No. 61/408,419, filed Oct. 29, 2010, entitled "DIGITAL PROGRAMMABLE ADAPTIVE WIDEBAND I/Q IMBALANCE COMPENSATION IN QUADRATURE RECEIVERS". Provisional Patent Application No. 61/408,419 is assigned to the assignee of the present application and is hereby incorporated by reference into the present application as if fully set forth herein. The present application hereby claims priority under 35 U.S.C. §119(e) to U.S. Provisional Patent Application No. 61/408,419.

TECHNICAL FIELD OF THE INVENTION

The present application relates generally to receivers in a wireless network and, more specifically, to digital I/Q imbalance compensation in a quadrature receiver.

BACKGROUND OF THE INVENTION

Quadrature modulation and demodulation schemes allow two message signals to be conveyed on a single carrier wave. The two message signals are usually out of phase or phase shifted by about ninety degrees. In a quadrature receiver, the two message signals can be retrieved from a received signal. For example, the quadrature receiver may include separate receiver paths, one of the receiver paths applying a phase shift to the received signal. The resulting signals are generally referred to as the 'I' (real) and the 'Q' (phase shifted) signals.

The I/Q signals are processed using different components along the separate receiver paths. Differences in the components used as processing applied to the I/Q signals can create an imbalance in between processed I/Q signals. For example, components along the I/Q paths may have different gain or frequency parameters. Additionally, due to hardware tolerances the phase shift applied to the Q signal may not be exactly ninety degrees. The differences along the I/Q paths creates self-imposed interference or distortion in the resulting signal. The distortion in the resulting signal raises the noise floor in baseband signal processing, which may result in signal loss and/or increased processing complexity.

Different I/Q imbalance compensation schemes attempt to reduce this self-imposed interference or distortion in different ways. However, current I/Q imbalance compensation schemes suffer from one or more of the following problems: 1) narrowband, 2) static, fixed compensation, 3) data/tone aided training, 4) not programmable, and/or 5) analog.

Therefore, there is a need for an improved I/Q imbalance compensation scheme. In particular, there is a need for a quadrature receiver that is capable of digital programmable adaptive wideband I/Q imbalance compensation.

SUMMARY OF THE INVENTION

In one illustrative embodiment, an apparatus reduces distortion in a processed signal. The apparatus includes a first receive path, a second receive path, a summation unit, and a compensation unit. The first receive path is configured to process a received analog signal into a first digital signal. The second receive path is configured to process the received analog signal with a phase shift into a second digital signal. The summation unit is configured to sum the first and second digital signals to form a processed digital signal. The compensation unit is configured to identify a conjugate of the processed digital signal, apply a weighting factor to the conjugate of the processed digital signal to form a weighted signal, and subtract the weighted signal from the processed digital signal to reduce the distortion.

In another illustrative embodiments, a receiver for reducing distortion in a processed signal is provided. The receiver includes a pair of quadrature receiver paths, a conjugate unit, an adaptation module, a weighting module, and a decoder. The pair of quadrature receiver paths is configured to process a received analog signal into a digital signal. The conjugate unit is configured to identify a conjugate of the processed digital signal. The adaptation module includes a filter bank. The adaptation module is configured to identify a set of weighting factors for one or more frequencies of the conjugate of the processed digital signal based on frequency dependent distortion identified using the filter bank. The weighting module is configured to apply the set of weighting factors to the conjugate of the processed digital signal to from a weighted signal and subtract the weighted signal from the processed digital signal to reduce the distortion. The decoder is configured to decode the processed digital signal.

In yet another illustrative embodiment, a method for reducing distortion in a processed signal in a receiver in a wireless communications network is provided. The method includes receiving an analog signal, processing the analog signal into a digital signal using a pair of quadrature receiver paths to form a processed digital signal, identifying a conjugate of the processed digital signal, applying a weighting factor to the conjugate of the processed digital signal to form a weighted signal, and subtracting the weighted signal from the processed digital signal to reduce the distortion.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; the term "set of" with reference to items means one or more items; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication system.

Figure 1:
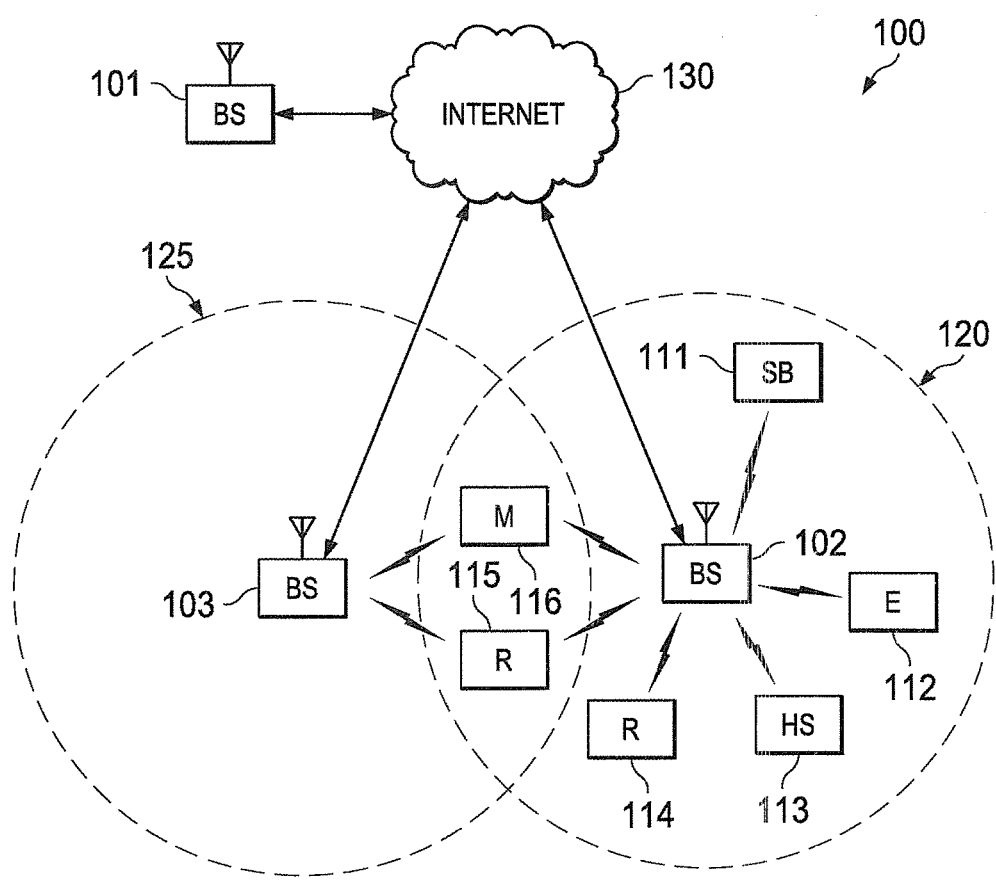
FIG. 1 illustrates an exemplary wireless system which transmits messages according to an illustrative embodiment of the present disclosure.

FIG. 1 illustrates an exemplary wireless system, which transmits messages according to an illustrative embodiment of the present disclosure. In the illustrated embodiment, wireless system 100 includes base station (BS) 101, base station (BS) 102, base station (BS) 103, and other similar base stations (not shown). Base station 101 is in communication with base station 102 and base station 103. Base station 101 is also in communication with Internet 130 or a similar IP-based system (not shown).

Base station 102 provides wireless broadband access (via base station 101) to Internet 130 to a first plurality of subscriber stations within coverage area 120 of base station 102. The first plurality of subscriber stations includes subscriber station 111, which may be located in a small business (SB), subscriber station 112, which may be located in an enterprise (E), subscriber station 113, which may be located in a WiFi hot spot (HS), subscriber station 114, which may be located in a first residence (R), subscriber station 115, which may be located in a second residence (R), and subscriber station 116, which may be a mobile device (M), such as a cell phone, a wireless laptop, a wireless PDA, or the like.

Base station 103 provides wireless broadband access (via base station 101) to Internet 130 to a second plurality of subscriber stations within coverage area 125 of base station 103. The second plurality of subscriber stations includes subscriber station 115 and subscriber station 116. In an exemplary embodiment, base stations 101-103 may communicate with each other and with subscriber stations 111-116 using OFDM or OFDMA techniques.

While only six subscriber stations are depicted in FIG. 1, it is understood that wireless system 100 may provide wireless broadband access to additional subscriber stations. It is noted that subscriber station 115 and subscriber station 116 are located on the edges of both coverage area 120 and coverage area 125. Subscriber station 115 and subscriber station 116 each communicate with both base station 102 and base station 103 and may be said to be operating in handoff mode, as known to those of skill in the art.

Subscriber stations 111-116 may access voice, data, video, video conferencing, and/or other broadband services via Internet 130. In an exemplary embodiment, one or more of subscriber stations 111-116 may be associated with an access point (AP) of a WiFi WLAN. Subscriber station 116 may be any of a number of mobile devices, including a wireless-enabled laptop computer, personal data assistant, notebook, handheld device, or other wireless-enabled device. Subscriber stations 114 and 115 may be, for example, a wireless-enabled personal computer (PC), a laptop computer, a gateway, or another device.

Figure 2:
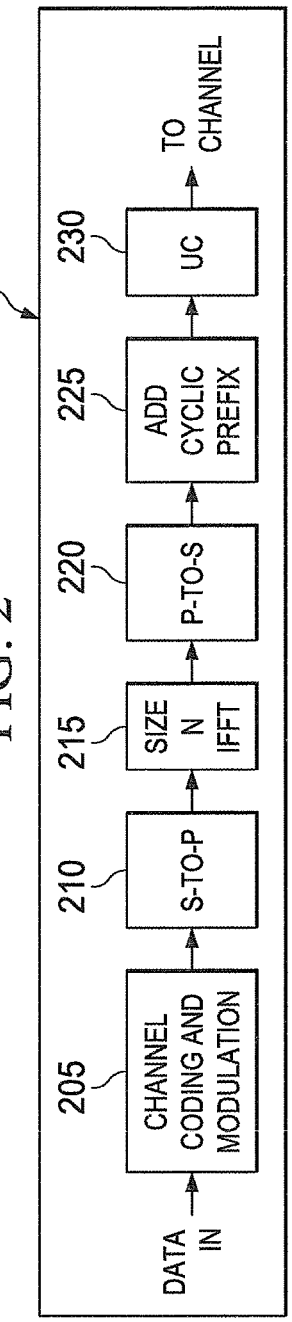
FIG. 2 illustrates a high-level diagram of an orthogonal frequency division multiple access transmit path according to an illustrative embodiment of the present disclosure.
Figure 3:
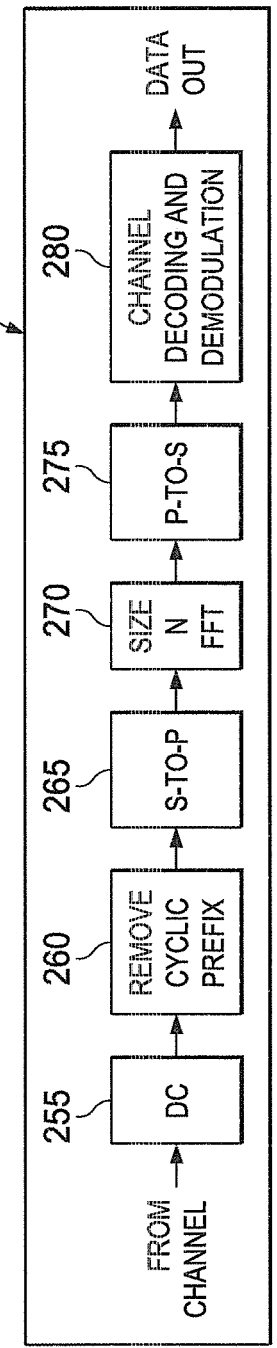
FIG. 3 illustrates a high-level diagram of an orthogonal frequency division multiple access receive path according to an illustrative embodiment of the present disclosure.

FIG. 2 is a high-level diagram of an orthogonal frequency division multiple access (OFDMA) transmit path. FIG. 3 is a high-level diagram of an orthogonal frequency division multiple access (OFDMA) receive path. In FIGS. 2 and 3, the OFDMA transmit path is implemented in base station (BS) 102 and the OFDMA receive path is implemented in subscriber station (e.g. subscriber station 116 of FIG. 1), and the OFDMA receive path 300 may be implemented in a base station (e.g. base station 102 of FIG. 1) for the purposes of illustration and explanation only.

Transmit path 200 comprises channel coding and modulation block 205, serial-to-parallel (S-to-P) block 210, Size N Inverse Fast Fourier Transform (IFFT) block 215, parallel-to-serial (P-to-S) block 220, add cyclic prefix block 225, up-converter (UC) 230. Receive path 300 comprises down-converter (DC) 255, remove cyclic prefix block 260, serial-to-parallel (S-to-P) block 265, Size N Fast Fourier Transform (FFT) block 270, parallel-to-serial (P-to-S) block 275, channel decoding and demodulation block 280.

At least some of the components in FIGS. 2 and 3 may be implemented in software while other components may be implemented by configurable hardware or a mixture of software and configurable hardware. In particular, it is noted that the FFT blocks and the IFFT blocks described in this disclosure document may be implemented as configurable software algorithms, where the value of Size N may be modified according to the implementation.

Furthermore, although this disclosure is directed to an embodiment that implements the Fast Fourier Transform and the Inverse Fast Fourier Transform, this is by way of illustration only and should not be construed to limit the scope of the disclosure. It will be appreciated that in an alternate embodiment of the disclosure, the Fast Fourier Transform functions and the Inverse Fast Fourier Transform functions may easily be replaced by Discrete Fourier Transform (DFT) functions and Inverse Discrete Fourier Transform (IDFT) functions, respectively. It will be appreciated that for DFT and IDFT functions, the value of the N variable may be any integer number (i.e., 1, 2, 3, 4, etc.), while for FFT and IFFT functions, the value of the N variable may be any integer number that is a power of two (i.e., 1, 2, 4, 8, 16, etc.).

In transmit path 200, channel coding and modulation block 205 receives a set of information bits, applies coding (e.g., LDPC coding) and modulates (e.g., Quadrature Phase Shift Keying (QPSK) or Quadrature Amplitude Modulation (QAM)) the input bits to produce a sequence of frequency-domain modulation symbols. Serial-to-parallel block 210 converts (i.e., de-multiplexes) the serial modulated symbols to parallel data to produce N parallel symbol streams where N is the IFFT/FFT size used in BS 102 and SS 116. Size N IFFT block 215 then performs an IFFT operation on the N parallel symbol streams to produce time-domain output signals. Parallel-to-serial block 220 converts (i.e., multiplexes) the parallel time-domain output symbols from Size N IFFT block 215 to produce a serial time-domain signal. Add cyclic prefix block 225 then inserts a cyclic prefix to the time-domain signal. Finally, up-converter 230 modulates (i.e., up-converts) the output of add cyclic prefix block 225 to RF frequency for transmission via a wireless channel. The signal may also be filtered at baseband before conversion to RF frequency.

The transmitted RF signal arrives at SS 116 after passing through the wireless channel and reverse operations to those at BS 102 are performed. Down-converter 255 down-converts the received signal to baseband frequency and remove cyclic prefix block 260 removes the cyclic prefix to produce the serial time-domain baseband signal. Serial-to-parallel block 265 converts the time-domain baseband signal to parallel time domain signals. Size N FFT block 270 then performs an FFT algorithm to produce N parallel frequency-domain signals. Parallel-to-serial block 275 converts the parallel frequency-domain signals to a sequence of modulated data symbols. Channel decoding and demodulation block 280 demodulates and then decodes the modulated symbols to recover the original input data stream.

Each of base stations 101-103 may implement a transmit path that is analogous to transmitting in the downlink to subscriber stations 111-116 and may implement a receive path that is analogous to receiving in the uplink from subscriber stations 111-116. Similarly, each one of subscriber stations 111-116 may implement a transmit path corresponding to the architecture for transmitting in the uplink to base stations 101-103 and may implement a receive path corresponding to the architecture for receiving in the downlink from base stations 101-103.

Figure 4:
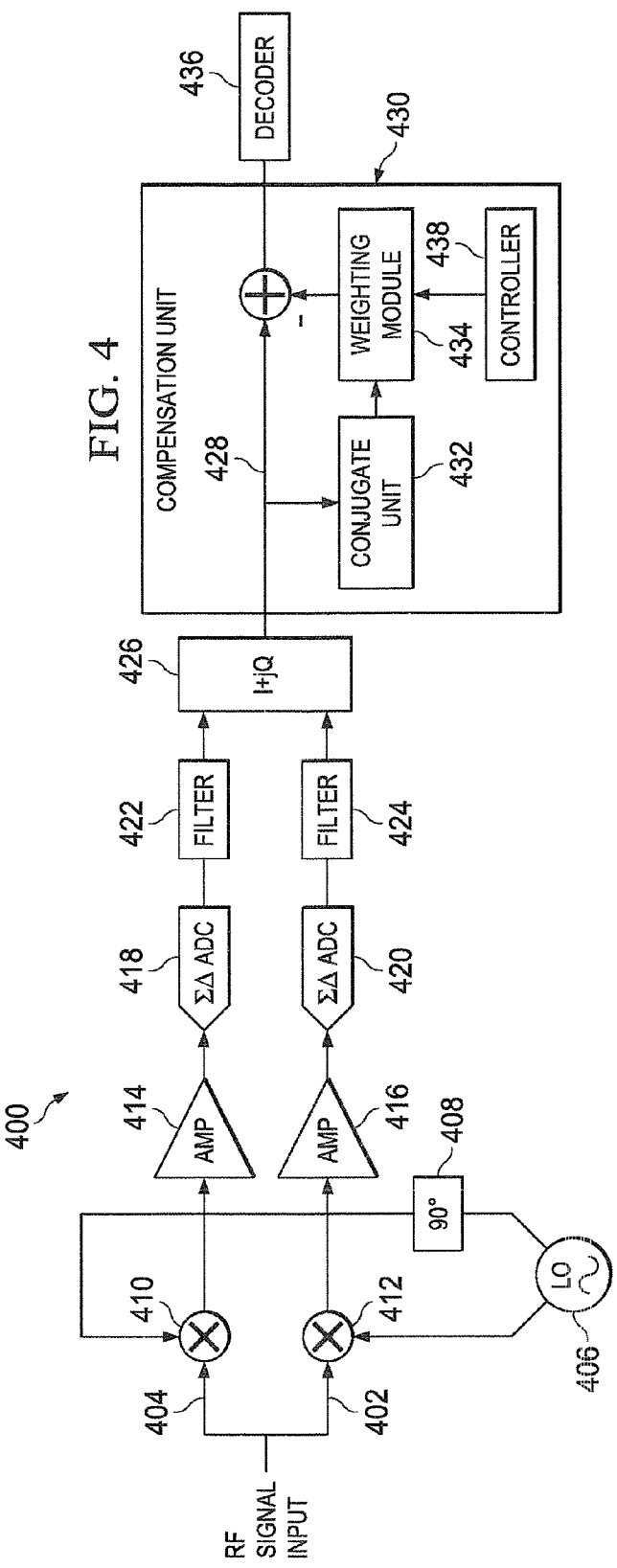
FIG. 4 illustrates a quadrature receiver with I/Q imbalance compensation in accordance with an illustrative embodiment of the present disclosure.

FIG. 4 illustrates a quadrature receiver with I/Q imbalance compensation in accordance with an illustrative embodiment of the present disclosure. Signals received by receiver 400 are passed onto paths 402 and 404.

In this illustrative example, local oscillator 406 in combination with phase shifter 408 and mixer 410 phase shift the signal along path 404 by about ninety degrees. Mixers 410 and 412 modify I/Q signals on paths 402 and 404 to an intermediate frequency. Amplifiers 414 and 416 amplify a power of I/Q signals on paths 402 and 404. Analog-to-digital converters 418 and 420 convert I/Q analog signals on paths 402 and 404 digital I/Q signals. Filters 422 and 424 filter out unwanted signals on paths 402 and 404. The resulting processed digital signals are the summed by summation unit 426 to form digital signal 428. Paths 402 and 404 are illustrative examples of receiver paths. Other hardware configurations may be used in addition to or instead of the components depicted on paths 402 and 404.

The different illustrative embodiments of the present disclosure recognize and take into account that any one of the components along paths 402 and 404 may cause an imbalance between the I and Q signals summed at summation unit 426. For example, phase shifter 408 may have a tolerance causing the phase shift applied at mixer 410 to be greater or less than ninety degrees, resulting in a phase imbalance between the I and Q signals. In another example, the amplitude of the I and Q signals may be modified differently due to phase shifter 408 being applied to just path 404 or to operational differences between amplifiers 414 and 416 and/or analog-to-digital converters 418 and 420. These are examples of frequency independent imbalances. In some examples, the gain of amplifiers 414 and 416 may not be flat. Thus, signals at different frequencies may be amplified differently. This example is an example of frequency dependent imbalance.

The different illustrative embodiments of the present disclosure recognize and take into account that attempting to account for all differences in components along paths 402 and 404 may be difficult and may vary for each integrated circuit implementation. The differences may vary for changes in temperature of the integrated circuitry. Also the differences may vary based on operating mode or band. Rather than attempt to identify and compensate for each possible variation in components along paths 402 and 404, the different illustrative embodiments of the present disclosure recognize that the distortion caused by I/Q imbalance results in amount of noise present on digital signal 428. For example, distortion caused by the by I/Q imbalance is reflected onto digital signal 428 output by summation unit 426.

In this illustrative embodiment, compensation unit 430 compensates for the I/Q imbalance between paths 402 and 404. Conjugate unit 432 transposes the complex conjugate of digital signal 428 about an axis, for example, the intermediate frequency of receiver 400. Due to the knowledge that the distortion caused by the by I/Q imbalance is reflected onto digital signal 428, the resulting transposed signal is proportional to the distortion present digital signal 428.

The transposed signal output from conjugate unit 432 is weighted by weighting module 434. Weighting module 434 applies weighting factor(s) to the transposed signal to form a weighted signal. Weighting module 434 scales the transposed signal to a similar magnitude of the distortion present digital signal 428. For example, weighting module 434 may be an array of programmable digital filters to adapt the transposed signal.

In one example, weighting module 434 includes a finite impulse response (FIR) filter including one or more taps. The number of taps in the FIR filter may be selected based on the bandwidth of the signal received at receiver 400. For example, controller 438 may identify the bandwidth of the signal and power on or off a number of taps based on the bandwidth. For example, a narrower bandwidth signal, e.g., a global system for mobile communications (GSM) signal, may only need one tap, while a wider bandwidth signal, e.g., a long term evolution (LTE) signal may use a larger number of taps, e.g., five taps. Each tap in the FIR filter applies a weighting factor to a range of frequencies in the transposed signal. In other words, each tap in the FIR filter scales a portion of the total transposed signal. Thus, compensation unit 430 can account for frequency dependent I/Q imbalances as well as modify the number of taps for wideband signals.

Compensation unit 430 subtracts the weighted signal from digital signal 428 to reduce the amount of I/Q imbalance distortion present in digital signal 428. Decoder 436 then decodes the resulting balanced signal.

In this example, compensation unit 430 additionally includes controller 438. Controller 438 includes software and/or hardware for controlling weighting module 434 to output the weighted signal. For example, controller 438 may identify information about operating band(s) or operating mode (e.g., GSM, CDMA, LTE, LTE advanced, etc.) to control one or more weighting factors or filter coefficients of weighting module 434. In another example, controller 438 may process one or more algorithms based on inputs from digital signal 428 to control one or more parameters of weighting module 434.

Figure 5:
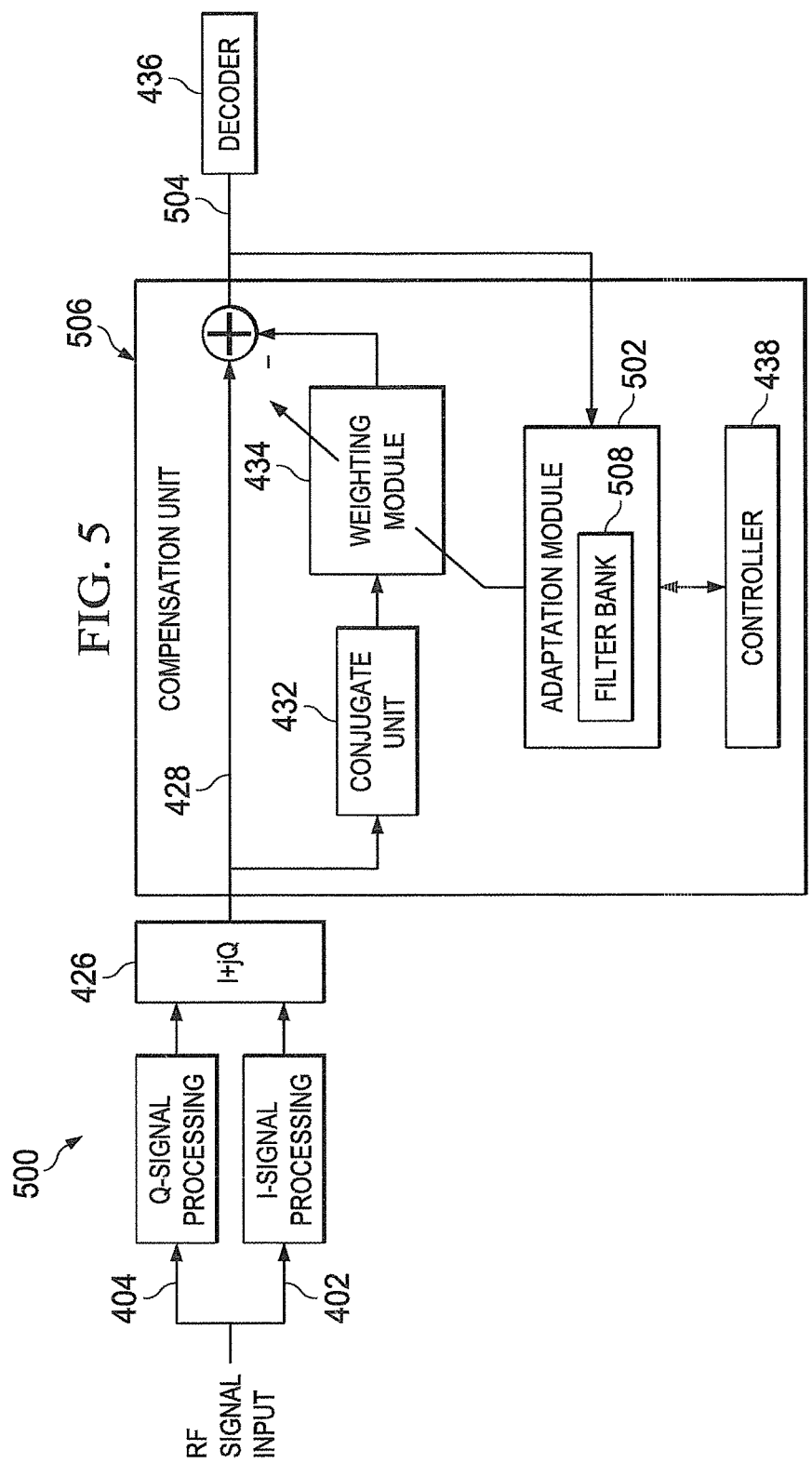
FIG. 5 illustrates a quadrature receiver with I/Q imbalance compensation including an adaptation module according to one embodiment of the present disclosure.

FIG. 5 illustrates a quadrature receiver with I/Q imbalance compensation including an adaptation module according to one embodiment of the present disclosure. Receiver 500 is an example of one implementation of receiver 400 in FIG. 4. In this illustrative embodiment, receiver 500 includes adaptation module 502 to adapt the signal subtracted from digital signal 428 based on signal 504 output from compensation unit 506. The continuous adaptation allows compensation unit 506 to improve the I/Q imbalance compensation in real time while the signal is received and processed.

As illustrated, adaptation module 502 includes filter bank 508. Filter bank 508 is one or more filters that are used to identify complex correlation statistics from signal 504. For example, filter bank 508 may includes individual filters for ranges of frequencies in signal 504.

Figure 6:
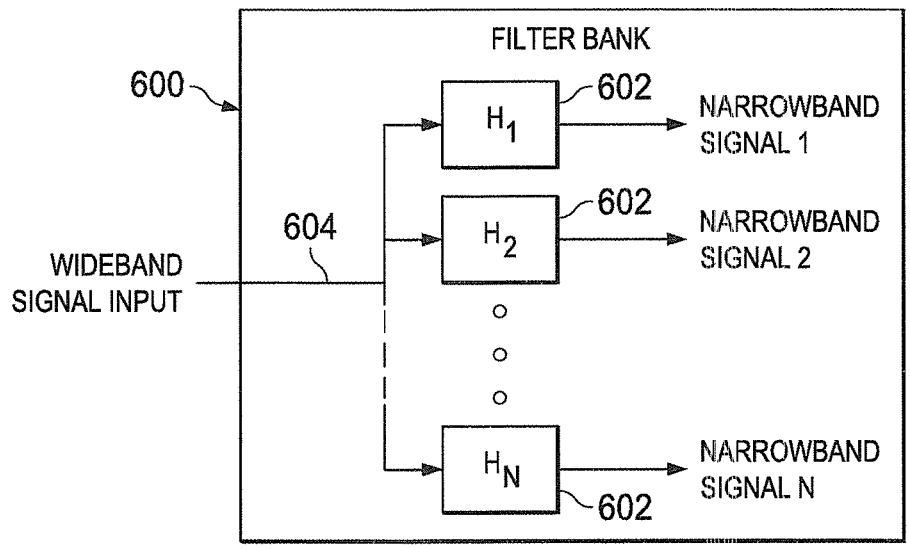
FIG. 6 illustrates a filter bank for a quadrature receiver according to an illustrative embodiment of the present disclosure.

FIG. 6 illustrates an example of one implementation of filter bank 508 for a quadrature receiver according to an illustrative embodiment of the present disclosure. As illustrated, filter bank 600 includes 'n' number of filters 602 tuned to filter narrower bands of frequencies from wideband input signal 604. In this example, wideband input signal 604 may be signal 504 output from compensation unit 506, digital signal 428 output from summation unit 426, or the signal received at receiver 400. Filters 602 can be digitally programmable filters. The number of filters 602 can be selected based on a bandwidth of wideband input signal 604. For example, wider bandwidth signals may result in a larger number of filters in filters 602.

Returning to FIG. 5, adaptation module 502 identifies the complex correlation statistics from signal 504 for each narrowband signal output from filters 602. Adaptation module 502 adapts coefficients of a FIR filter in weighting module 434 using a least means squares type of adaptation algorithm. The adaptation algorithm can be trained on the signal itself, which enables continuous adaptation in receiver 500. For example, the adaptation algorithm may be calculated according to equation 1 below:

$$w^{(k)} = w^{(k-1)} - \mu \cdot z(t)[z(t), z(t-T_s), \ldots z(t-nT_s)]^T \quad \text{Equation 1.}$$

where w is a vector of the weighting factor for weighting factor update 'k,' $\mu$ is a step size parameter, z(t) is signal 504 output from compensation unit 506, n is a tap in the multi-tap filter from 0 to n (e.g., n+1 taps in the multi-tap filter), and $T_s$ is the time step of signal 504.

Figure 7:
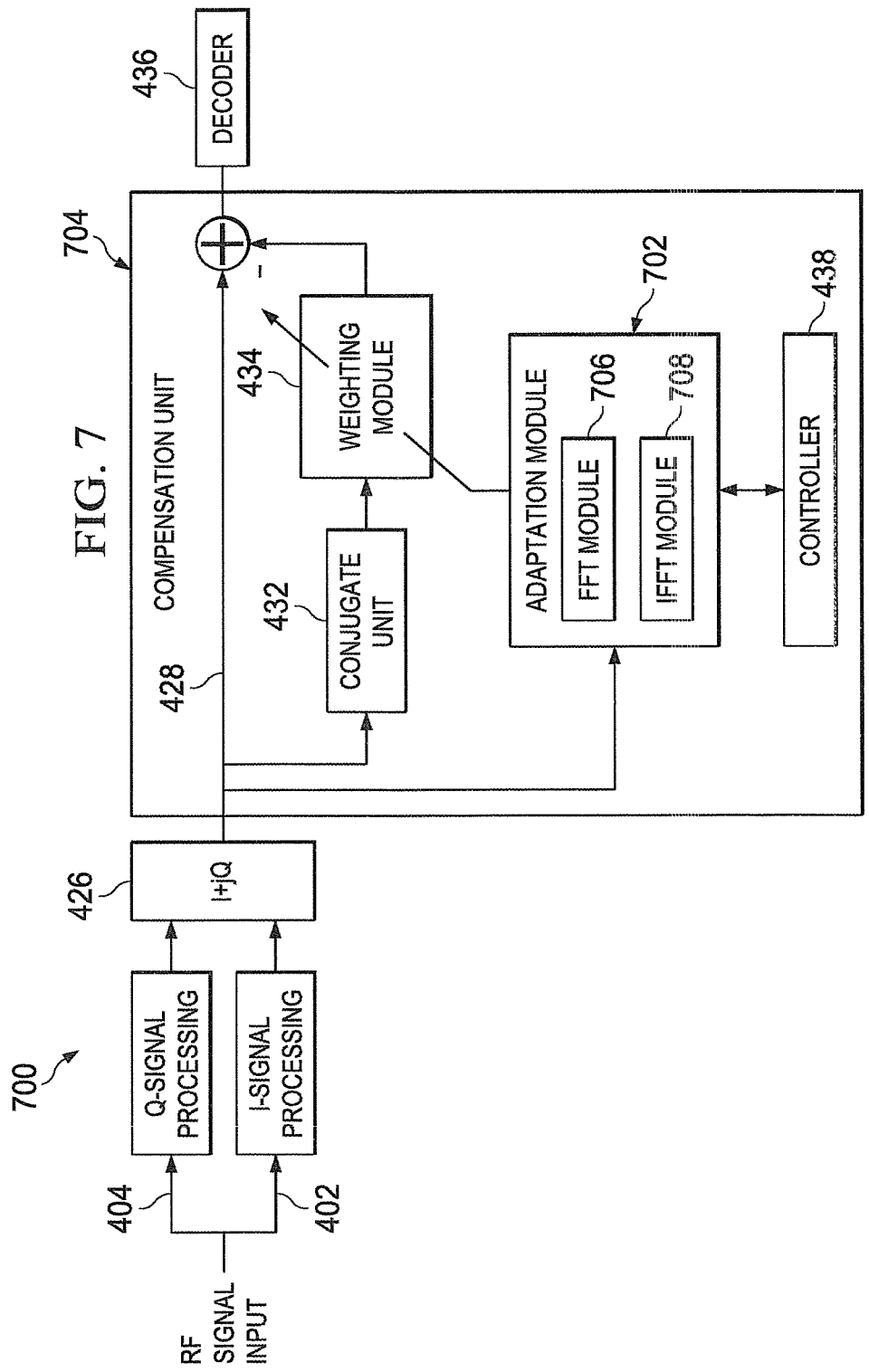
FIG. 7 illustrates a quadrature receiver with I/Q imbalance compensation including an adaptation module according to another embodiment of the present disclosure.

FIG. 7 illustrates a quadrature receiver with I/Q imbalance compensation including an adaptation module according to another embodiment of the present disclosure. Receiver 700 is an example of one implementation of receiver 400 in FIG. 4. In this illustrative embodiment, receiver 700 includes adaptation module 702 to adapt the signal subtracted from digital signal 428 based on digital signal 428 output from summation unit 426. In this illustrative example, the filter bank is implemented using a fast FFT module 706 to compute distortion parameters of digital signal 428 in the frequency domain. For example, the distortion parameters may be computed according to Equations 2 and 3 below:

$$g = \frac{\sqrt{E(|FFT_I|^2)}}{\sqrt{E(|FFT_Q|^2)}}. \quad \text{Equation 2}$$

where g is a distortion parameter for amplitude imbalance, $FFT_I$ is the FFT of the I signal, where $FFT_Q$ is the FFT of the Q signal, and E(x) is a function for the expected value of x; and $$\varphi = \frac{\sum FFT_I * FFT_Q}{\sum |FFT_I||FFT_Q|}. \quad \text{Equation 3}$$

where $\phi$ is a distortion parameter for phase imbalance.

Adaptation module 702 then converts the distortion parameters of digital signal 428 in the frequency domain into filter coefficients in the time domain for the FIR filter in weighting module 434 using an IFFT module 708 to compute the filter coefficients. The continuous adaptation allows compensation unit 704 to improve the I/Q imbalance compensation in real time while the signal is received and processed. For example, the filter coefficients of digital signal 428 in the time domain may be calculated according to Equation 4 below:

$$w = IFFT\left[\frac{ge^{-j\varphi} - 1}{conj(ge^{j\varphi} + 1)}\right]. \quad \text{Equation 4}$$

where w is a vector of the weighting factor, and conj(x) is a function for the complex conjugate of x.

Figure 8:
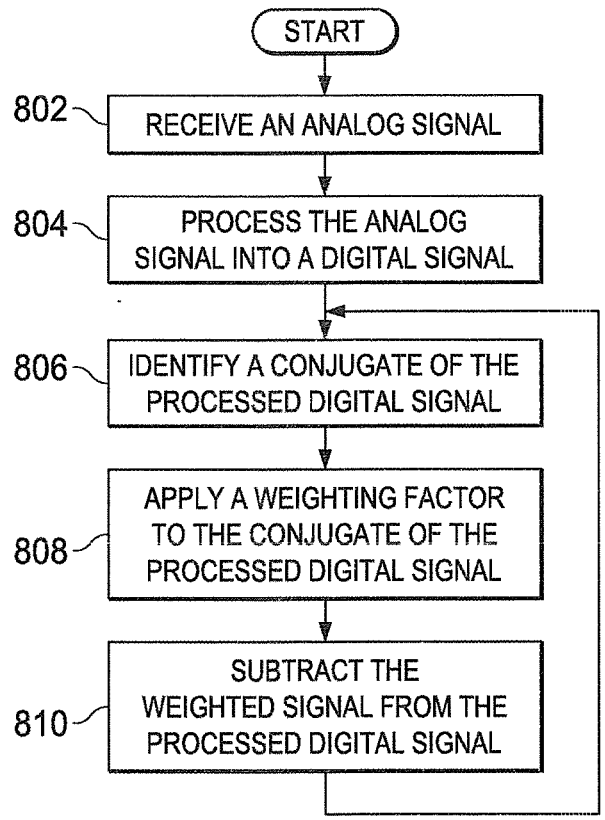
FIG. 8 illustrates a process for reducing distortion in a processed signal according to an illustrative embodiment of the present disclosure.

FIG. 8 illustrates a process for reducing distortion in a processed signal according to an illustrative embodiment of the present disclosure. For example, the process may be implemented by receiver 400 in FIG. 4.

The process begins by receiving an analog signal (block 802). The process then processes the analog signal into a digital signal (block 804). In block 804, the analog signal is processed by separate I and Q signal paths. The I and Q signals are summed to form the processed digital signal.

Thereafter, the process identifies a conjugate of the processed digital signal (block 806). In block 806, the complex conjugate of the processed digital signal may be transposed about an intermediate frequency.

The process then applies a weighting factor to the conjugate of the processed digital signal (block 808). In block 808, the process may identify a set of weighting factors using frequency independent distortion identified for one or more ranges of frequencies in the processed digital signal using a filter bank including one or more filters for each frequency range. The set of weighting factors can be applied to different ranges of frequencies in the conjugate of the processed digital signal using a FIR filter having a number of taps based on the number of ranges of frequencies. For example, the process may identify from complex correlation statistics from an output a compensation unit and adapt coefficients of the FIR filter using a least mean squares algorithm to identify the set of weighting factors.

In another example, the process may identify distortion parameters in the processed digital signal in a frequency domain and converting the distortion parameters into coefficients of the FIR filter a time domain to identify the set of weighting factors. The process may also select the number of taps in the FIR filter and the number of filters in the filter bank based on bandwidth of the received analog filter or a receiving mode of the receiver.

Thereafter, the process subtracts the weighted signal from the processed digital signal (block 810). In block 810, the distortion caused by the I/Q imbalance is reduced by using the weighted signal to approximate the distortion in the process signal caused by the I/Q imbalance. This distortion is reduced by subtracting out the weighted signal. The process then returns to block 806 and continues to adapt the weighted signal based on the processed digital signal. The process may terminate upon lack of a signal received at step 802. The process may also terminate upon the receiver being powered off.

Thus the different illustrative embodiments provide digital programmable systems and methods for adaptively compensating and correcting for I/Q imbalance in a quadrature receiver without modifying the analog portion of the receiver. The digital I/Q imbalance compensation system trains using received incoming transmitted data signals from a programmable filter bank to obtain amplitude imbalance and phase imbalance information on which to adaptively converge to a set of I/Q imbalance compensation coefficients. Depending on the received signal bandwidth, the I/Q imbalance compensation unit can compensate for narrowband, frequency independent IQ imbalance, and for wideband frequency dependent IQ imbalance.

Considering multi-mode multi-band communications network, the present disclosure reduces the I/Q imbalance on the digital side, which greatly reduces the burden in the analog side. Implementation of I/Q imbalance compensation on the digital side will take advantage of digital circuit process scaling. For example, digital I/Q imbalance compensation can improve signal error rate, and reduce power, size and component costs in subscriber stations and base stations.

One skilled in the art understands various I/Q imbalance contributors come from the analog and mixed signal blocks within the receiver. The proposed technique does not rectify these contributors locally, and therefore, is agnostic to the extent and cause of I/Q imbalance. Further, because the proposed technique does not locally correct the cause of I/Q imbalance, the proposed technique achieves I/Q imbalance compensation without perturbation to receiver performance or imposition of timing requirements.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. For use in a wireless communications network, a receiver configured to reduce distortion in a processed signal, the receiver comprising:
    a first receive path configured to process a received analog signal into a first digital signal;
    a second receive path configured to process the received analog signal with a phase shift into a second digital signal;
    a summation unit configured to sum the first and second digital signals to form a processed digital signal; and
    a compensation circuit comprising a hardware controller and a weighting module, the compensation circuit configured to:
        identify a processed digital signal conjugate from the processed digital signal,
        apply a set of weighting factors to the processed digital signal conjugate to form a weighted signal by identifying frequency independent distortion for one or more ranges of frequencies in the processed digital signal using a filter bank including one or more filters based on a receiving mode of the receiver and by applying the set of weighting factors to the one or more ranges of frequencies of the processed digital signal conjugate to form a frequency dependent weighted signal as the weighted signal to be subtracted from the process digital signal, and
        subtract the weighted signal from the processed digital signal to reduce the distortion.

2. The receiver of claim 1, wherein the compensation circuit comprises:
    a finite impulse response (FIR) filter including one or more taps is based on a receiving mode, the FIR filter configured to apply the set of weighting factors to the processed digital signal conjugate to form the weighted signal.

3. The receiver of claim 2, wherein
    the one or more filters each configured to identify the frequency independent distortion for the one or more ranges of frequencies in the processed digital signal.

4. The receiver of claim 3, wherein the compensation circuit further comprises:
    an adaptation module including the filter bank, the adaptation module configured to identify the set of weighting factors for the one or more ranges of frequencies in the processed digital signal conjugate based on the frequency independent distortion identified using the filter bank to form the weighted signal as the weighted signal to be subtracted from the processed digital signal.

5. The receiver of claim 1, wherein the compensation circuit further comprises:
    an adaptation module including the filter bank, the adaptation module configured to identify complex correlation statistics from an output of the compensation circuit and adapt coefficients for a finite impulse response (FIR) filter using an adaptation algorithm, wherein the FIR filter is configured to apply the set of weighting factors to the processed digital signal conjugate to form the weighted signal.

6. The receiver of claim 3, wherein the filter bank comprises:
    a fast Fourier transform (FFT) module configured to identify distortion parameters in the processed digital signal in a frequency domain; and
    an inverse FFT module configured to convert the distortion parameters into coefficients for a finite impulse response (FIR) filter in a time domain.

7. The receiver of claim 6, wherein the compensation circuit further comprises:
    an adaptation module including the filter bank, the adaptation module configured to apply the weighting factors to the conjugate of the processed digital signal based on the distortion parameters in the time domain.

8. The receiver of claim 2, wherein the compensation circuit is further configured to identify the receiving mode.

9. The apparatus of claim 1, wherein the distortion in the processed signal is a real and phase shift (I/Q) imbalance distortion caused by components in the first and second receive paths, and wherein the compensation circuit is configured to compensate for the I/Q imbalance distortion in the processed digital signal without separate inputs from the components in the first and second receive paths.

10. The receiver of claim 1, wherein the receiver is a quadrature receiver in a subscriber station in the wireless communications network.

11. The receiver of claim 1, wherein the receiver is a quadrature receiver in a base station in the wireless communications network.

12. For use in a wireless communications network, a receiver configured to reduce distortion in a processed signal, the receiver comprising:
    a pair of quadrature receiver paths configured to process a received analog signal into a processed digital signal;
    a conjugate circuit configured to identify a conjugate of the processed digital signal;

an adaptation module including a filter bank, the adaptation module configured to identify a set of weighting factors for one or more frequencies of the conjugate of the processed digital signal based on frequency dependent distortion identified using the filter bank;

a weighting module configured to apply the set of weighting factors to the conjugate of the processed digital signal to form a weighted signal and subtract the weighted signal from the processed digital signal to reduce the distortion, wherein the weighting module comprises a finite impulse response (FIR) filter including one or more taps based on a receiving mode of the receiver, and wherein the adaptation module is further configured to identify complex correlation statistics from an input into a decoder and adapt coefficients of the FIR filter using an adaptation algorithm; and the decoder configured to decode the processed digital signal.

13. The receiver of claim 12, wherein the filter bank comprises one or more filters, the one or more filters each configured to identify frequency independent distortion for one or more ranges of frequencies in the processed digital signal.

14. The receiver of claim 12, wherein the filter bank comprises a fast Fourier transform (FFT) module configured to identify distortion parameters in the processed digital signal in a frequency domain and an inverse FFT module configured to convert the distortion parameters into coefficients for the weighting module in a time domain, and wherein the adaptation module is further configured to identify the set of weighting factors to the conjugate of the processed digital signal based on the coefficients in the time domain using the filter bank.

15. The receiver of claim 12, wherein the adaptation module is further configured to identify the receiving mode of the receiver and select a number of taps to be included in the finite impulse response (FIR) filter based on a bandwidth of the received analog signal.

16. The receiver of claim 12, wherein the adaption algorithm comprises a least means squares type of adaption algorithm.

17. A method for reducing distortion in a processed signal in a receiver in a wireless communications network, the method comprising:

receiving an analog signal;

processing the analog signal into a digital signal using a pair of quadrature receiver paths to form a processed digital signal;

identifying a conjugate of the processed digital signal;

applying a set of weighting factors to the conjugate of the processed digital signal to form a weighted signal, wherein applying the set of weighting factors to the conjugate of the processed digital signal comprises:

identifying frequency independent distortion for one or more ranges of frequencies in the processed digital signal using a filter bank including one or more filters based on a receiving mode of the receiver; and applying the set of weighting factors to the one or more ranges of frequencies of the conjugate of the processed digital signal based on the frequency independent distortion identified to form a frequency dependent weighted signal as the weighted signal to be subtracted from the processed digital signal; and subtracting the weighted signal from the processed digital signal to reduce the distortion.

18. The method of claim 17, wherein the weighting factors are applied using a finite impulse response (FIR) filter including one or more taps based on the receiving mode of the receiver, the method further comprising:

identifying complex correlation statistics from an output comprising the weighted signal subtracted from the processed digital signal; and adapting coefficients of the FIR filter using an adaptation algorithm.

19. The method of claim 17, further comprising:

identifying distortion parameters in the processed digital signal in a frequency domain; and converting the distortion parameters into filter coefficients in a time domain, wherein applying the set of weighting factors to the conjugate of the processed digital signal comprises:

applying the set of weighting factors to the conjugate of the processed digital signal based on the filter coefficients in the time domain.

20. The method of claim 17, wherein the set of weighting factors is applied to different ranges of frequencies in the conjugate of the processed digital signal using a finite impulse response (FIR) filter including a number of taps based on the number of ranges of frequencies.

* * * * *